US010951967B2

(12) United States Patent
Lemons et al.

(10) Patent No.: US 10,951,967 B2
(45) Date of Patent: Mar. 16, 2021

(54) VOICE-CONTROLLED MULTIMEDIA DEVICE AND UNIVERSAL REMOTE

(71) Applicant: Amazon Technologies, Inc., Seattle, WA (US)

(72) Inventors: Joshua Lemons, Los Gatos, CA (US); Giovanni Mata Magana, East Palo Alto, CA (US); Miguel Virgen, San Jose, CA (US); Thompson Quang-Tue Nguyen, San Jose, CA (US); Chia Hung Kuo, San Jose, CA (US); Yao Xue, San Mateo, CA (US)

(73) Assignee: Amazon Technologies, Inc., Seattle, WA (US)

( * ) Notice: Subject to any disclaimer, the term of this patent is extended or adjusted under 35 U.S.C. 154(b) by 0 days.

(21) Appl. No.: 15/684,454

(22) Filed: Aug. 23, 2017

(65) Prior Publication Data
US 2019/0069058 A1 Feb. 28, 2019

(51) Int. Cl.
*H04R 1/04* (2006.01)
*H04R 1/02* (2006.01)
(Continued)

(52) U.S. Cl.
CPC .............. *H04R 1/028* (2013.01); *G06F 3/167* (2013.01); *G06F 11/325* (2013.01); *H03J 9/06* (2013.01);
(Continued)

(58) Field of Classification Search
CPC .......... H04R 1/028; H04R 1/025; H04R 1/04; H04R 2420/07; H04N 21/43635; G06F 3/167; G06F 11/325; H04W 84/12; H03J 9/06

USPC .............. 381/110, 91, 92, 315; 455/563, 92, 455/151.1, 352; 379/88.01; 704/275; 398/128, 135, 106; 340/870.28, 4.11,
(Continued)

(56) References Cited

U.S. PATENT DOCUMENTS 5,548,654 A * 8/1996 Fast .......................... H04R 3/00
381/77
7,996,753 B1 8/2011 Chan et al.
(Continued)

FOREIGN PATENT DOCUMENTS

WO 2019/040307 A1 2/2019

OTHER PUBLICATIONS

Product Description for AnyMote Home, <http://www.anymote.io/>, Accessed Nov. 29, 2017.
(Continued)

*Primary Examiner* — Vivian C Chin
*Assistant Examiner* — Con P Tran
(74) *Attorney, Agent, or Firm* — Eversheds Sutherland (US) LLP

(57) ABSTRACT

Systems, methods, and computer-readable media are disclosed for voice-controlled multimedia devices and universal remotes. In one embodiment, an example device may include a housing, a first circuit board, a second circuit board, a first infrared light emitting diode (LED) positioned on the first circuit board and configured to emit infrared light in a first direction, a second infrared LED positioned on the first circuit board and configured to emit infrared light in a second direction opposite the first direction, a microphone disposed on the second circuit board, and an HDMI port.

20 Claims, 8 Drawing Sheets

(51) Int. Cl.
*H03J 9/06* (2006.01)
*H04W 84/12* (2009.01)
*H04N 21/4363* (2011.01)
*G06F 11/32* (2006.01)
*G06F 3/16* (2006.01)

(52) U.S. Cl.
CPC .............. *H04R 1/025* (2013.01); *H04R 1/04* (2013.01); *H04N 21/43635* (2013.01); *H04R 2420/07* (2013.01); *H04W 84/12* (2013.01)

(58) Field of Classification Search
USPC .... 340/426.13; 438/14.05, 114, 211.99, 734; 367/117, 133; 386/234
See application file for complete search history.

(56) References Cited

U.S. PATENT DOCUMENTS

| | | | |
|---|---|---|---|
| 9,462,340 | B1* | 10/2016 | Mathurin ....... H04N 21/234336 |
| 9,641,919 | B1 | 5/2017 | Poole et al. |
| 10,528,977 | B1 | 1/2020 | Jogia et al. |
| 10,896,439 | B1 | 1/2021 | Jogia et al. |
| 2001/0051517 | A1 | 12/2001 | Strietzel |
| 2002/0184098 | A1 | 12/2002 | Giraud et al. |
| 2009/0037279 | A1 | 2/2009 | Chockalingam et al. |
| 2009/0319272 | A1 | 12/2009 | Coulomb et al. |
| 2011/0040636 | A1 | 2/2011 | Simmons et al. |
| 2011/0087529 | A1 | 4/2011 | Angell |
| 2011/0122623 | A1* | 5/2011 | Miura ................ G01N 21/8806 362/249.02 |
| 2011/0235281 | A1 | 9/2011 | Mittleman |
| 2013/0193465 | A1* | 8/2013 | Xu ........................ H01L 33/504 257/98 |
| 2013/0332167 | A1 | 12/2013 | Kilgore |
| 2014/0006117 | A1 | 1/2014 | Kritt et al. |
| 2014/0053212 | A1* | 2/2014 | Shoykher ................ G06F 3/017 725/59 |
| 2014/0074627 | A1 | 3/2014 | Kucharz et al. |
| 2014/0304063 | A1 | 10/2014 | English et al. |
| 2015/0022620 | A1* | 1/2015 | Siminoff .............. H04M 11/025 348/14.02 |
| 2015/0331449 | A1* | 11/2015 | Ng ........................ G06F 1/1607 345/175 |
| 2016/0071162 | A1 | 3/2016 | Ogawa et al. |
| 2017/0093031 | A1* | 3/2017 | Svendsen ................ H01Q 5/20 |
| 2017/0206900 | A1* | 7/2017 | Lee ........................ G10L 15/08 |
| 2019/0069058 | A1 | 2/2019 | Lemons et al. |

OTHER PUBLICATIONS

International Search Report and Written Opinion dated Nov. 2, 2018 for PCT/US2018/046511 filed Aug. 13, 2018; 11 pgs.
Satarski et al., "Breed Better Banners: Design Automation through on-line interaction" 2002, Journal of Interactive marketing, 16 (12) (2002), P2-3 (year: 2002).
Office Action for European Patent Application No. 18770146.1 dated Jan. 11, 2021; 6 pages.

* cited by examiner

VOICE-CONTROLLED MULTIMEDIA DEVICE AND UNIVERSAL REMOTE

BACKGROUND

Multimedia devices may be used to output digital content for consumption. Universal remote control devices may be used to control one or more multimedia devices. However, to effectively use a universal remote control device, or other remote control, the device may have to be pointed or aimed in a certain direction, such as at a device that a user wishes to control. Accordingly, users may have to locate and physically interact with such remote control devices in order to control other devices. Such remote control devices and multimedia devices may therefore require physical interaction by users

Figure 1:
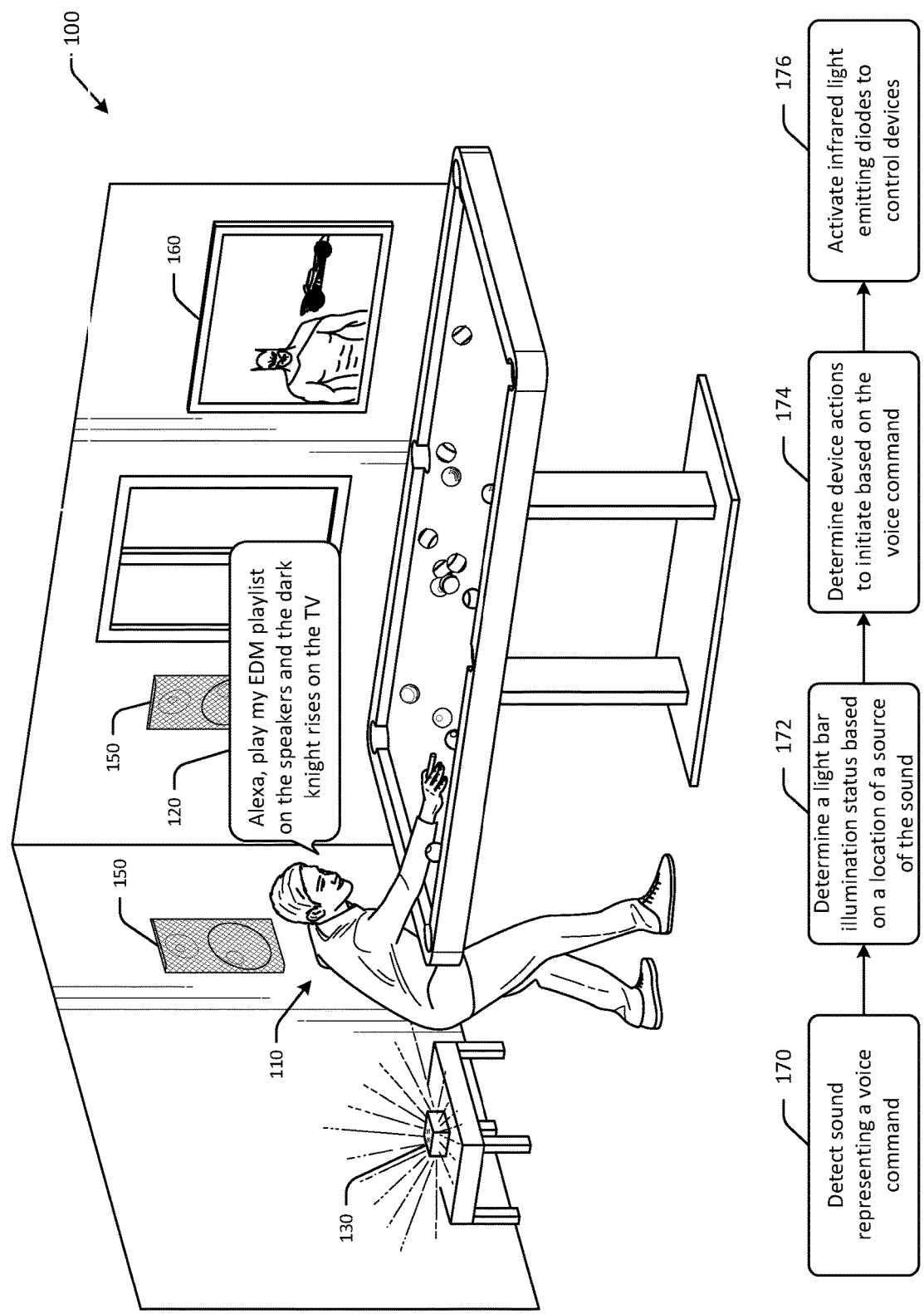
FIG. 1 is an example use case and schematic drawing of a voice-controlled multimedia device and universal remote configured to control one or more devices in accordance with one or more embodiments of the disclosure.

The detailed description is set forth with reference to the accompanying drawings. The drawings are provided for purposes of illustration only and merely depict example embodiments of the disclosure. The drawings are provided to facilitate understanding of the disclosure and shall not be deemed to limit the breadth, scope, or applicability of the disclosure. The use of the same reference numerals indicates similar, but not necessarily the same or identical components. Different reference numerals may be used to identify similar components. Various embodiments may utilize elements or components other than those illustrated in the drawings, and some elements and/or components may not be present in various embodiments. The use of singular terminology to describe a component or element may, depending on the context, encompass a plural number of such components or elements and vice versa.

DETAILED DESCRIPTION

Overview

Multimedia devices may be used to output digital content, and in some instances, to cause content to be presented at one or more display devices for consumption by users. For example, multimedia devices may be content streaming devices that stream digital content, and may be configured to read one or more data storage devices (e.g., USB drives, DVDs, etc.) to cause presentation of content stored on the data storage device. Universal remote controls may be remote controllers or remote control devices that can be used to wirelessly control one or more other electronic devices, such as multimedia devices, display devices, speaker devices, lighting devices, and other devices suitable for remote control. Universal remote control devices may be configured to control more than one electronic device.

Embodiments of the disclosure may include voice-controlled multimedia devices that can also function as universal remote controls. Voice-controlled devices may be devices that can initiate one or more actions responsive to audible or voice inputs, such as by a user speaking commands. Certain embodiments may include multimedia devices that can output digital audio and video, and that can also control other electronic devices. In some instances, embodiments may be configured to detect certain trigger words spoken in an ambient environment, as well as voice commands that can be detected. A meaning of a detected voice command or other voice-based request may be determined, and certain embodiments may initiate one or more response actions in response to the voice command or voice-based request.

The techniques, methods, and processes described herein may be used to detect and/or determine voice-based requests or commands, and to initiate actions that may include controlling other electronic devices. For example, certain embodiments may include a device with a set of one or more infrared light emitting diodes (LEDs) that can be used to wirelessly communicate with other electronic devices. The LEDs may be configured to emit infrared light in "blasts" or in a manner such that a hemisphere of infrared coverage, or substantially a hemisphere of infrared coverage, is emitted about the device. The LEDs may be arranged such that infrared light is emitted in all directions of a plane about a perimeter of the device (e.g., radially outward or about a circumference of the device, in one example). As a result, embodiments may be able to control other electronic devices without having to be pointed or aimed in any particular direction, such as at an infrared detection device of the electronic device. While described in the context of infrared LEDs, this disclosure is more broadly applicable to other forms of infrared light, LEDs, and wireless communication components.

This disclosure relates to, among other things, systems, methods, computer-readable media, techniques, and methodologies for voice-controlled multimedia devices and universal remotes. Embodiments may include devices that can be voice-controlled and respond to audible instructions, output digital content for presentation at a device, and control other electronic devices. Some embodiments include a light bar or other visual indicator that can be used to convey certain information to a user, such as a detected location or direction of sound or a sound source, or a detected location of the user that is currently being listened to by the device. As a result, embodiments of the disclosure may be configured to control multiple electronic devices in an ambient environment without having to be manipulated or pointed at the respective devices, and may be configured to react to voice-based instructions, thereby reducing or removing a need for users to physically control the device. Certain embodiments may include light bar features or other components that can be used to convey information to users.

Referring to FIG. 1, an example use case 100 and schematic drawing of voice-controlled multimedia device and universal remote configured to control one or more devices is depicted in accordance with one or more embodiments of the disclosure. A user 110 may be in an ambient environment with a number of electronic devices, such as an audio system 150, a television 160, wirelessly controlled lighting, and other electronic devices configured to be controlled remotely. A voice-controlled multimedia device and universal remote 130 may be in the ambient environment of the user 110, such as on a table, in a cabinet, or elsewhere in the ambient environment.

The user 110 may verbally interact with the voice-controlled multimedia device and universal remote 130 to control the voice-controlled multimedia device and universal remote 130, as well as to control other electronic devices in the ambient environment. For example, the user 110 may utter a phrase 120 with instructions or commands, such as "Alexa, play my EDM playlist on the speakers and the dark knight rises on the TV."

The voice-controlled multimedia device and universal remote 130 may detect the audible sound from the user 110 and may determine a meaning of the phrase 120. For example, the voice-controlled multimedia device and universal remote 130 may detect a trigger word or a wakeword of "Alexa," or another trigger word, and may subsequently begin monitoring for voice commands using one or more microphones. In some embodiments, detection and/or processing of voice data or voice commands may be done locally at the voice-controlled multimedia device and universal remote 130, while in other embodiments the voice-controlled multimedia device and universal remote 130 may communicate with one or more servers to determine a meaning of a voice command, such as the phrase 120. In some embodiments, the trigger word may be detected and determined locally, while voice commands may be processed remotely.

After determining or receiving the meaning of the user utterance, or the phrase 120 in the example of FIG. 1, is determined, the voice-controlled multimedia device and universal remote 130 may initiate one or more response actions. For example, the voice-controlled multimedia device and universal remote 130 may determine that the user 110 wants to (i) play a certain music playlist on the speakers or audio system 150; and (ii) play a certain movie on the television 160. In some instances, the voice-controlled multimedia device and universal remote 130 may present content locally and sequentially (e.g., music using a local speaker or loudspeaker, output video content using an HDMI port, etc.), while in other instances, the voice-controlled multimedia device and universal remote 130 may present content locally at the same time. In other instances, the voice-controlled multimedia device and universal remote 130 may control other devices that may be used to present content, such as a speaker system or tablet. The voice-controlled multimedia device and universal remote 130 may therefore initiate response actions of activating the audio system 150 and streaming the playlist, and causing the movie to presented on the television 160.

To implement the response actions, the voice-controlled multimedia device and universal remote 130 send one or more commands or instructions using infrared light communication with, in this example, the audio system 150. The voice-controlled multimedia device and universal remote 130 may include a housing with a number of sidewalls, and a set of one or more infrared LEDs that are configured to emit infrared light through each of the sidewalls, such that infrared light is emitted three hundred sixty degrees about the voice-controlled multimedia device and universal remote 130 in at least one planar direction, and well as in additional planar directions, so as to provide infrared coverage of a relatively large portion of the ambient environment. In some embodiments, the voice-controlled multimedia device and universal remote 130 may include infrared LEDs oriented or positioned in opposite directions, so as to increase infrared LED coverage of the ambient environment.

The voice-controlled multimedia device and universal remote 130 may also include a high definition multimedia interface (HDMI) port configured to output ultra high-definition digital content (e.g., 4K resolution, UHD resolution, etc.). The voice-controlled multimedia device and universal remote 130 may be connected to the television 160 wirelessly or via the HDMI port, and may cause streaming of the requested movie with presentation at the television 160.

Accordingly, the voice-controlled multimedia device and universal remote 130 may cause instructions or a command to be communicated to the audio system 150 to begin playback of the requested playlist using the infrared LEDs, and may cause the requested movie to be presented at the television 160 either through a wired HDMI (or other suitable port) connection or a wireless connection.

In an example process flow, at a first operation 170, the voice-controlled multimedia device and universal remote 130 may detect sound representing a voice command. For example, the voice-controlled multimedia device and universal remote 130 may detect the phrase 120 uttered by the user 110. At a second operation 172, the voice-controlled multimedia device and universal remote 130 may determine a light bar illumination status based on a location or direction of a source of the sound. For example, the voice-controlled multimedia device and universal remote 130 may include a light bar component that visually represents information to the user 110. The light bar component may include one or more color LEDs that can be activated based at least in part on a microphone that detected the highest level of sound from the user 110, or based at least in part on an estimated location of the user 110 with respect to the voice-controlled multimedia device and universal remote 130. At a third operation 174, the voice-controlled multimedia device and universal remote 130 may determine device actions to initiate based on the voice command. For example, in FIG. 1, the voice-controlled multimedia device and universal remote 130 may determine that the playlist is to be played at the audio system 150 and the movie is to be played at the television 160. At a fourth operation 176, the voice-controlled multimedia device and universal remote 130 may activate infrared LEDs to control devices, such as the audio system 150 and/or the television 160, in accordance with the example of FIG. 1.

As a result, the user 110 may be able to control multiple electronic devices in an ambient environment by speaking to the voice-controlled multimedia device and universal remote 130, and without having to point or aim the voice-controlled multimedia device and universal remote 130 in any particular direction. The voice-controlled multimedia device and universal remote 130 may output commands with infrared light coverage that covers a large area, such as a hemisphere with respect to the voice-controlled multimedia device and universal remote 130 itself.

Example embodiments of the disclosure provide a number of technical features or technical effects. For example, in accordance with example embodiments of the disclosure, certain embodiments of the disclosure may increase an amount of infrared light coverage and emission from a device, control multiple electronic devices in different locations in an ambient environment without physically moving locations, detect voice commands, determine meanings of voice commands, initiate actions in response to voice commands, and output digital content data using physically wired or wireless connections. The above examples of technical features and/or technical effects of example embodiments of the disclosure are merely illustrative and not exhaustive.

One or more illustrative embodiments of the disclosure have been described above. The above-described embodiments are merely illustrative of the scope of this disclosure and are not intended to be limiting in any way. Accordingly, variations, modifications, and equivalents of the embodiments disclosed herein are also within the scope of this disclosure. The above-described embodiments and additional and/or alternative embodiments of the disclosure will be described in detail hereinafter through reference to the accompanying drawings.

Illustrative Embodiments and Use Cases

Figure 2:
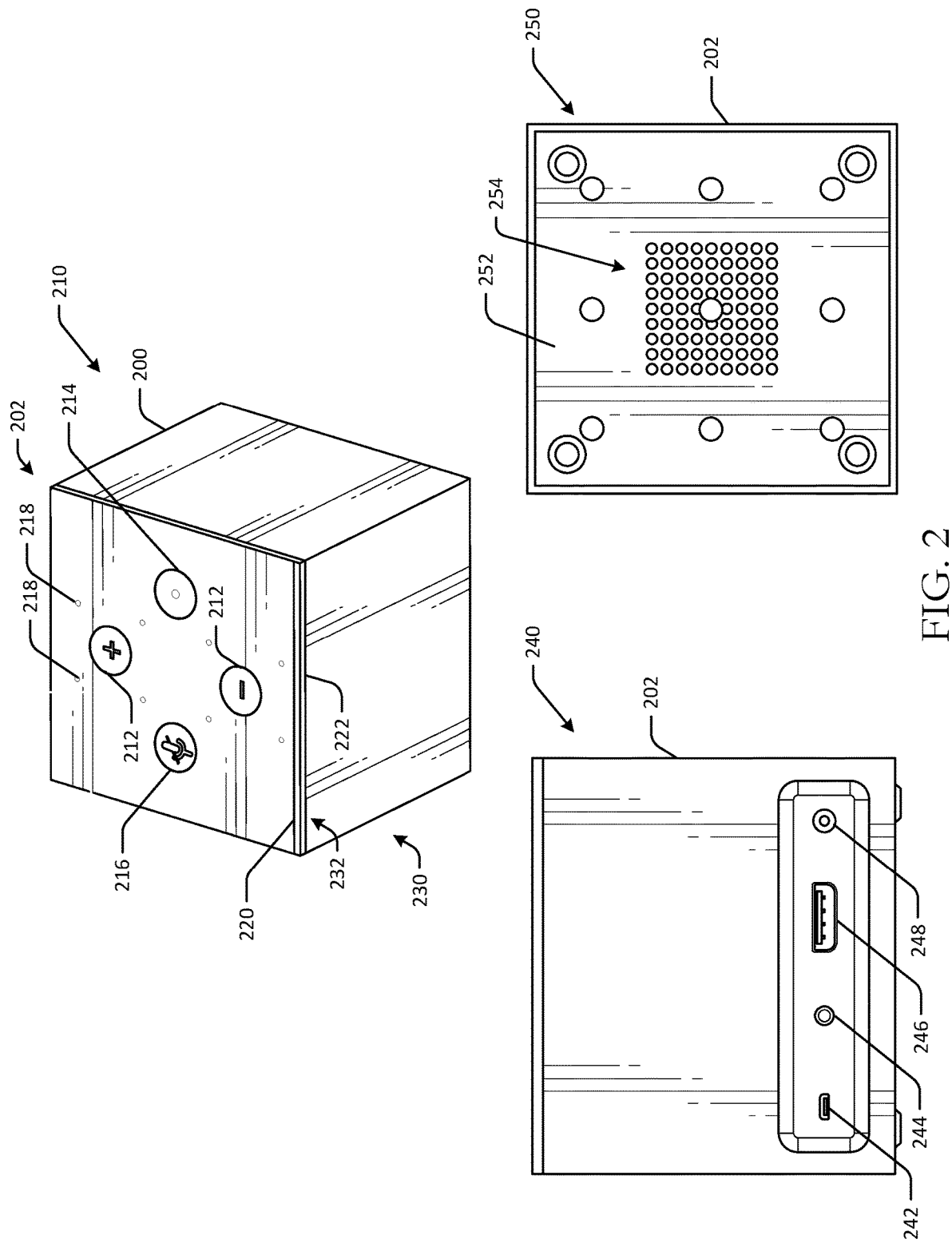
FIG. 2 is a schematic drawing of a voice-controlled multimedia device and universal remote in various views in accordance with one or more embodiments of the disclosure.

FIG. 2 schematically depicts a voice-controlled multimedia device and universal remote 200 in various views in accordance with one or more embodiments of the disclosure. As illustrated in perspective view 210, the voice-controlled multimedia device and universal remote 200 may have a box-like housing 202. Specifically, the housing 202 may have a number of sidewalls that form sides of the device, as well as walls forming top and bottom surfaces. The voice-controlled multimedia device and universal remote 200 may include a set of infrared LEDs that are configured to emit infrared light through each of the sidewalls, and in some embodiments, through the top and bottom surfaces, of the housing 202. Other embodiments may have different form factors. In some embodiments, the voice-controlled multimedia device and universal remote 200 may be treated with a water resistant coating.

The voice-controlled multimedia device and universal remote 200 may include one or more physical controls, such as buttons, switches, and other control devices. For example, the voice-controlled multimedia device and universal remote 200 may include volume control buttons 212 that control a speaker volume of the voice-controlled multimedia device and universal remote 200 or of a connected device. The voice-controlled multimedia device and universal remote 200 may include an action button 214, a mute button or a privacy button 216, and other buttons. In some embodiments, the voice-controlled multimedia device and universal remote 200 may include a display or other component.

The voice-controlled multimedia device and universal remote 200 may include one or more microphone holes 218 that can be used to facilitate detection of ambient sound by one or more microphones positioned within the housing 202.

The voice-controlled multimedia device and universal remote 200 may include a light bar component 220. The light bar component 220 may be include an optically clear or colored elongated component 222 through which light from one or more LEDs may be visible. The light bar component 220 may be positioned at a front side 230 of the voice-controlled multimedia device and universal remote 200. In some embodiments, such as the illustrated embodiment, the light bar component 220 may be linear or straight and may be positioned along an edge 232 of the housing 202. The elongated component 222 may therefore be attached to, or integrated into, the housing 202 and may form an edge of the housing 202. The light bar component 220 may be configured to indicate a location of sound detected by the voice-controlled multimedia device and universal remote 200. For example, if a microphone of the voice-controlled multimedia device and universal remote 200 detects sound or voice coming from a left side of the voice-controlled multimedia device and universal remote 200, one or more LEDs on the left side of the voice-controlled multimedia device and universal remote 200 may be caused to illuminate, so as to indicate to a user that sound is being detected from the left side of the voice-controlled multimedia device and universal remote 200. The light bar component 220 may dynamically modify LEDs that are illuminated while sound or voice is detected, and may also be used to visually communicate information to a user. For example, during processing, the light bar component 220 may have a certain illumination status, while the device is muted, the light bar component 220 may have a different illumination status, and so forth. The light bar component 220 may be a straight or linear light bar component and may be visible to users. In some embodiments, the light bar component 220 may be positioned elsewhere, along different edges or surfaces, and can be positioned diagonally or in another orientation respective to the housing of the device.

A rear side 240 of the voice-controlled multimedia device and universal remote 200 is illustrated in FIG. 2. The rear side 240 of the voice-controlled multimedia device and universal remote 200 may include one or more ports, inputs, outputs, and the like. For example, the rear side 240 may include an Ethernet port, USB, or micro USB input 242, a power input jack 244, an HDMI port 246 configured to output high definition video and audio, a 248, an external infrared light blaster connection port 248 (e.g., infrared light sensor input or output jack, etc.), and the like. In some embodiments, the voice-controlled multimedia device and universal remote 200 may include a rechargeable battery.

A bottom surface 250 of the voice-controlled multimedia device and universal remote 200 may be formed by a bottom wall 252 and may include components such as rubber feet, nonslip material, and other components to support the device. The bottom wall 252 may include speaker holes 254 to facilitate sound output from one or more speakers of the voice-controlled multimedia device and universal remote 200.

Figure 3:
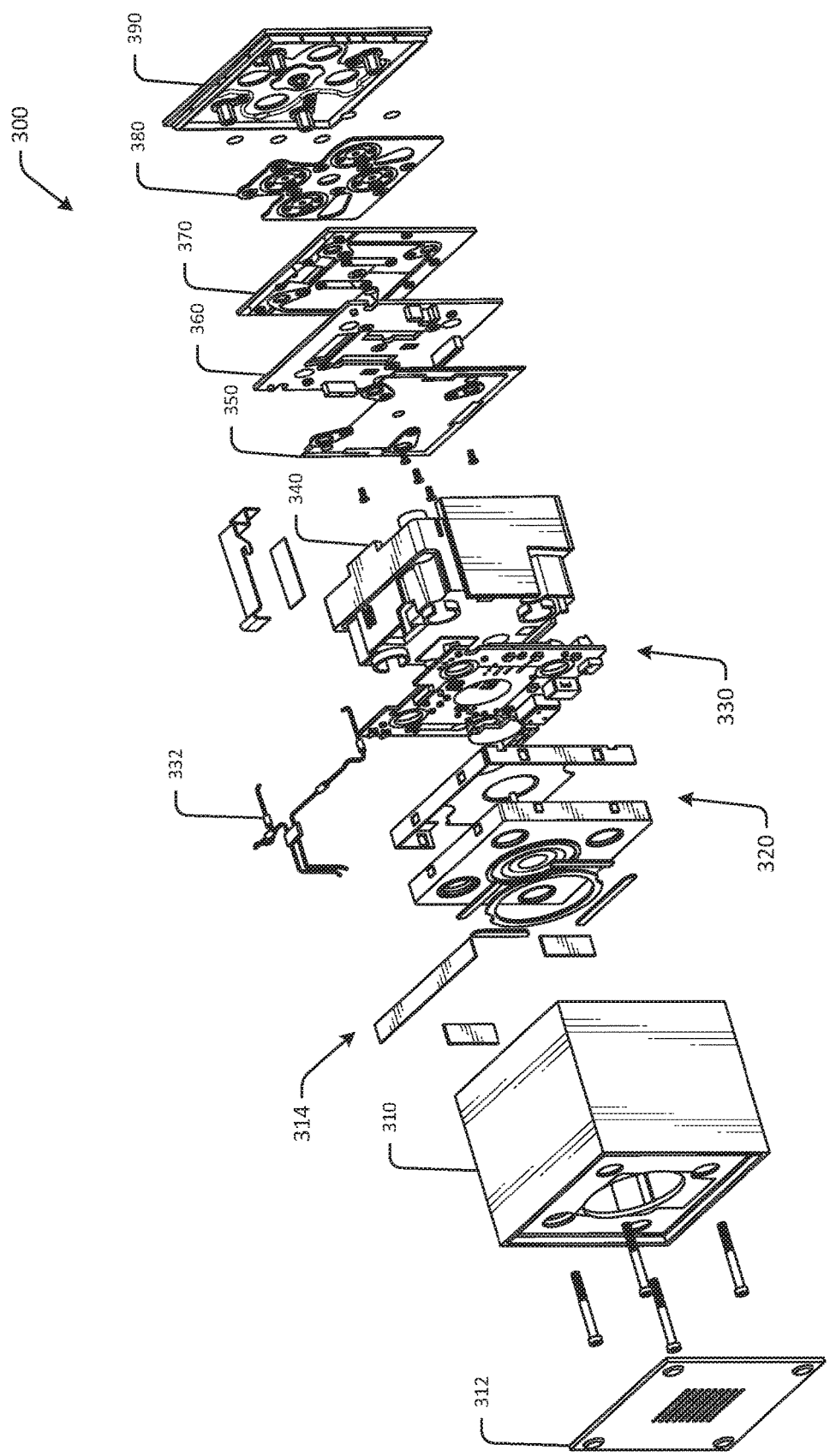
FIG. 3 is a schematic drawing of a voice-controlled multimedia device and universal remote in an exploded view in accordance with one or more embodiments of the disclosure.

FIG. 3 schematically depicts a voice-controlled multimedia device and universal remote 300 in an exploded view in accordance with one or more embodiments of the disclosure. The voice-controlled multimedia device and universal remote 300 may be the voice-controlled multimedia device and universal remote of FIG. 2, or may be a separate embodiment. Other embodiments may include additional or fewer components than those illustrated in FIG. 3.

The voice-controlled multimedia device and universal remote 300 may include a bottom plate 312 that may form a bottom wall or bottom surface ("top," "bottom," and "side" are used to describe relative and not absolute positioning) of a housing of the voice-controlled multimedia device and universal remote 300. The bottom plate 312 may include a number of openings or holes through which sound from one or more speakers may pass. The bottom plate 312 may include a number of feet or support components to separate the voice-controlled multimedia device and universal remote 300 from a surface on which the device is positioned.

The bottom plate 312 may be coupled to an outer structure 310 of the housing of the voice-controlled multimedia device and universal remote 300. The outer structure 310 may include a number of sidewalls. The bottom plate 312 may be secured to the outer structure 310 with screws, adhesives, bolts, or another suitable connection mechanism.

The voice-controlled multimedia device and universal remote 300 may include one or more portions of light blocking tape 314. The light blocking tape 314 may be configured to block or prevent light from propagating through the housing of the voice-controlled multimedia device and universal remote 300. For example, the light blocking tape 314 in FIG. 3 may be positioned along a front side of the outer structure 310, as well as along partial or entire sidewalls adjacent to the front side, and may prevent light from LEDs of a light bar component from propagating through the outer structure 310. As a result, light from the LEDs of the light bar component may not be visible through the outer structure 310 to a user looking at the voice-controlled multimedia device and universal remote 300, for example. The light blocking tape 314 may be formed from a light blocking or light shielding material, such as polyethylene terephthalate, rubber, etc., and may be adhered to one or more interior surfaces of the outer structure 310 of the housing.

The voice-controlled multimedia device and universal remote 300 may include a speaker assembly 320 that includes one or more speaker devices configured to output sound, and related cushioning components and heat spreading components to facilitate operation of the speaker. The speaker assembly 320 may be positioned adjacent to the bottom plate 312 of the voice-controlled multimedia device and universal remote 300. Other components, such as thermal features, support features, and the like, may be optionally included or removed from the device.

A main board 330 may be positioned in the housing adjacent to the speaker assembly 320. The main board 330 may be one of multiple boards in the voice-controlled multimedia device and universal remote 300. The main board 330 may be a printed circuit board or other suitable substrate and may include one or more electrical components. The main board 330 may be a first circuit board of the voice-controlled multimedia device and universal remote 300. In some embodiments, only one circuit board may be included.

A heat sink 340 may be included and configured to transfer heat from the electrical components of the voice-controlled multimedia device and universal remote 300. The heat sink 340 may be coupled to one or more heat generating components of the voice-controlled multimedia device and universal remote 300, such as the main board 330. The heat sink 340 may dissipate heat from certain components of the voice-controlled multimedia device and universal remote 300.

The voice-controlled multimedia device and universal remote 300 may include a light blocking shroud component 350 that is configured to prevent or block light from propagating from a top of the voice-controlled multimedia device and universal remote 300 through the voice-controlled multimedia device and universal remote 300 to the bottom plate 312. As a result, light may be prevented from propagating through portions of the outer structure 310, and may therefore not be visible to users through the outer structure 310.

A spacer 360 may be positioned between the light blocking shroud component 350 and a microphone circuit board 370. The microphone circuit board 370 may be a printed circuit board or other suitable substrate and may include one or more electrical components, such as one or more far-field microphones. The microphone circuit board 370 may be a second circuit board of the voice-controlled multimedia device and universal remote 300. In some embodiments, the spacer 360 may be used to space the microphone circuit board 370 from the main board 330 to reduce interference or to prevent interference between components on the respective boards. For example, the microphone circuit board 370 may include one or more antennae, such as a WiFi antenna disposed on the microphone circuit board 370, and the main board 330 may include one or more components, such as an HDMI port, that may cause radio interference with each other. In some embodiments, RF cables 332 may be used to electrically couple one or more antennae on the microphone circuit board 370 to one or more components, such as a controller, positioned on the main board 330. The spacer 360, along with the positioning of the potentially interfering components on different circuit boards that are physically separated may reduce the potential for interference between components of the voice-controlled multimedia device and universal remote 300.

A button subassembly 380 may be positioned adjacent to the microphone circuit board 370. The button subassembly 380 may be form of a rubber or composite material, and may be coupled to a top plate 390 that forms a top of the housing of the voice-controlled multimedia device and universal remote 300. The button subassembly 380 may be accessible from the top plate 390. The top plate 390 may be secured to the outer structure 310 to complete the housing of the voice-controlled multimedia device and universal remote 300.

An example method of assembly of the voice-controlled multimedia device and universal remote 300 includes mounting a microphone mesh component to the top plate 390, and mounting the button subassembly 380 to the top plate 390, with the microphone mesh component between the button subassembly and the top plate 390. The microphone circuit board 370 may be coupled to the top plate 390, followed by coupling the RF cables 332 to the microphone circuit board 370 and mounting the spacer 350 to the top plate assembly.

The spacer 360 may be positioned adjacent to the microphone circuit board 360 and the light blocking shroud component 350 may be positioned adjacent to the spacer 360. The heat sink 340 may be coupled to the assembled top plate module, and the main board 330 may be coupled to the combined heat sink and top plate assembly. The RF cables 332 may be connected to the main board 330. The speaker assembly 320 may be coupled to the combined body module, and the combined speaker assembly and body module may be secured inside the outer structure 310. The bottom plate 312 may be coupled to the outer structure 310 to form the housing of the voice-controlled multimedia device and universal remote 300.

Figure 4:
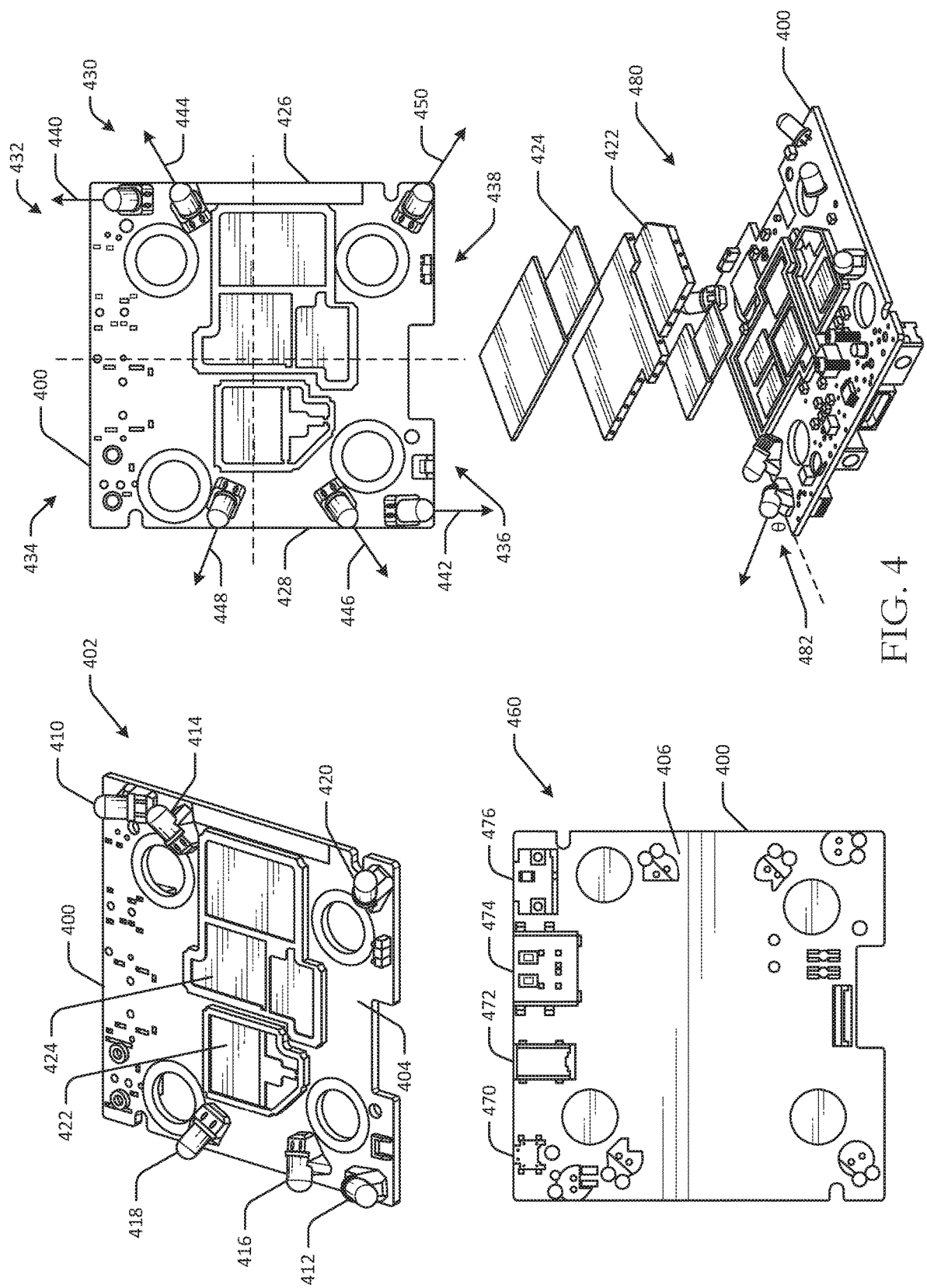
FIG. 4 is a schematic drawing of a main circuit board in accordance with one or more embodiments of the disclosure.

FIG. 4 schematically depicts a main circuit board 400 in accordance with one or more embodiments of the disclosure. The main circuit board 400 is illustrated in perspective view 402, top view 430, bottom view 460, and exploded view 480. The main circuit board 400 may be a printed circuit board or another substrate configured to support one or more electrical components.

One or more LEDs may be disposed on a first surface 404 of the main circuit board 400. The LEDs may be infrared LEDs in some embodiments. For example, in the example of FIG. 4, a set of LEDs may include six infrared LEDs disposed on a surface of the main circuit board 400. The set of LEDs may include a first infrared LED 410, a second infrared LED 412, a third infrared LED 414, a fourth infrared LED 416, a fifth infrared LED 418, and a sixth infrared LED 420. Other embodiments may include additional or fewer LEDs, and/or different types of LEDs. A WiFi shield fence 422 or other radio frequency shield component may be disposed on the main circuit board 400. Some embodiments may include a CPU shield fence 424 positioned adjacent to the WiFi shield fence 422.

LEDs disposed on the main circuit board 400 may be oriented at certain angles relative to each other and/or axes of the main circuit board 400. The LEDs may be arranged in a non-uniform arrangement, such as that illustrated in FIG. 4. Some LEDs may be angled upwards or downwards with respect to a planar surface (e.g., top surface, etc.) of the main circuit board 400. The LEDs may have the same upwards or downwards orientations, or different upwards or downwards orientations with respect to the main circuit board 400. In the example of FIG. 4, the LEDs may be angled at a direction 482 at about a 60 degree angle relative to the surface of the main circuit board 400, or about a 30 degree angle relative to a vertical axis (e.g., Z-axis) of the main circuit board 400, as indicated by θ. As illustrated in the exploded view 480, one or more thermal shields may be optional.

In the illustrated embodiment, the first infrared LED 410 may be oriented or configured to emit infrared light in a first direction 440. Light emitted from the first infrared LED 410 may be emitted in a number of directions; however, the first infrared LED 410 may be oriented or positioned such that a central axis of the first infrared LED 410 is aligned with the first direction 440. The central axis may be an axis passing through or near a center of the LED, as determined in a cross-sectional view. The first direction 440 may be parallel to a first edge 426 of the main circuit board 400, or may be offset (e.g., substantially aligned, etc.), such as offset by about 1 degree or another amount.

The second infrared LED 412 may be oriented or configured to emit infrared light in a second direction 442. The second direction 442 may be opposite the first direction 440. For example, if the first direction 440 is in the positive X direction, the second direction 442 may be in the negative X direction. In another example, the second direction 442 may be offset from parallel to an edge of the main circuit board 400 by the same amount as the first direction 440, but in the opposite direction. In some embodiments, the central axis of the first infrared LED 410 may form a first angle with respect to the first edge 426 of the main circuit board 400, and the central axis of the second infrared LED 412 may form the same first angle with respect to the same first edge 426 or a different edge, such as a second edge 428, but in the opposite direction. Accordingly, light emitted from the second infrared LED 412 may be concentrated in a direction opposite that of light emitted from the first infrared LED 410.

The third infrared LED 414 may be oriented or configured to emit infrared light in a third direction 444. For example, a central axis of the third infrared LED 414 may be aligned with the third direction 444. The fourth infrared LED 416 may be oriented or configured to emit infrared light in a fourth direction 446. For example, a central axis of the fourth infrared LED 416 may be aligned with the fourth direction 446. The fourth direction 446 may be opposite, or substantially opposite, the third direction 444.

The fifth infrared LED 418 may be oriented or configured to emit infrared light in a fifth direction 448. For example, a central axis of the fifth infrared LED 418 may be aligned with the fifth direction 448. The sixth infrared LED 420 may be oriented or configured to emit infrared light in a sixth direction 450. For example, a central axis of the sixth infrared LED 420 may be aligned with the sixth direction 450. The sixth direction 450 may be opposite, or substantially opposite the fifth direction 448.

In an example embodiment, each of the third direction 444, fourth direction 446, fifth direction 448, and sixth direction 450 may be about 60 degrees relative to an edge of the main circuit board (e.g., the first edge 426 for the third direction 444 and the sixth direction 450, and the second edge 428 for the fourth direction 446 and the fifth direction 448, etc.). In the illustrated embodiment, the sixth direction 450 and/or the central axis of the sixth infrared LED 420 may be angled toward a corner of the main circuit board 400.

Although the set of LEDs are illustrated in a particular arrangement in the example of FIG. 4, other embodiments may have different arrangements. For example, in some embodiments, some or all of the LEDs may be in a circular arrangement, or may form a circle on the main circuit board 400.

As illustrated in the top view 430, the main circuit board 400 may be divided into quadrants, with various LEDs positioned in different quadrants. For example, the main circuit board 400 may include a first quadrant 432, a second quadrant 434, a third quadrant 436, and a fourth quadrant 438. In FIG. 4, the first infrared LED 410 and the third infrared LED 414 may be positioned in the first quadrant 432, the fifth infrared LED 418 may be positioned in the second quadrant 434, the second infrared LED 412 and the fourth infrared LED 416 may be positioned in the third quadrant 436, and the sixth infrared LED 420 may be positioned in the fourth quadrant 438. Other embodiments may have a different distribution of LEDs or a different orientation of one or more of the LEDs. However, the distribution of the LEDs may affect the infrared coverage of an ambient environment output by the LEDs. An infrared reader component may be positioned on the main circuit board (illustrated along an edge in the fourth quadrant 438 in FIG. 4) and may be used to learn or train the device with codes received or detected from a different remote control.

Additional components may be integrated into or disposed on the main circuit board 400. For example, a USB or micro USB port 470 may be disposed on a second side 406 of the main circuit board 400. The second side 406 may be opposite the first side 404 of the main circuit board 400. An infrared jack 472 may be disposed on the second side 406 of the main circuit board 400. An HDMI port 474 and power jack 476 may be positioned on the second side 406 of the main circuit board 400. In some embodiments, a WiFi controller or other component may be positioned on the main circuit board 400, and may be coupled to one or more antennae on another circuit board, such as a microphone circuit board. Operation of the set of LEDs and/or one or more other components of the voice-controlled multimedia device and universal remote may be controlled by one or more controllers or processors on the main circuit board 400 or on another board of the device.

Figure 5:
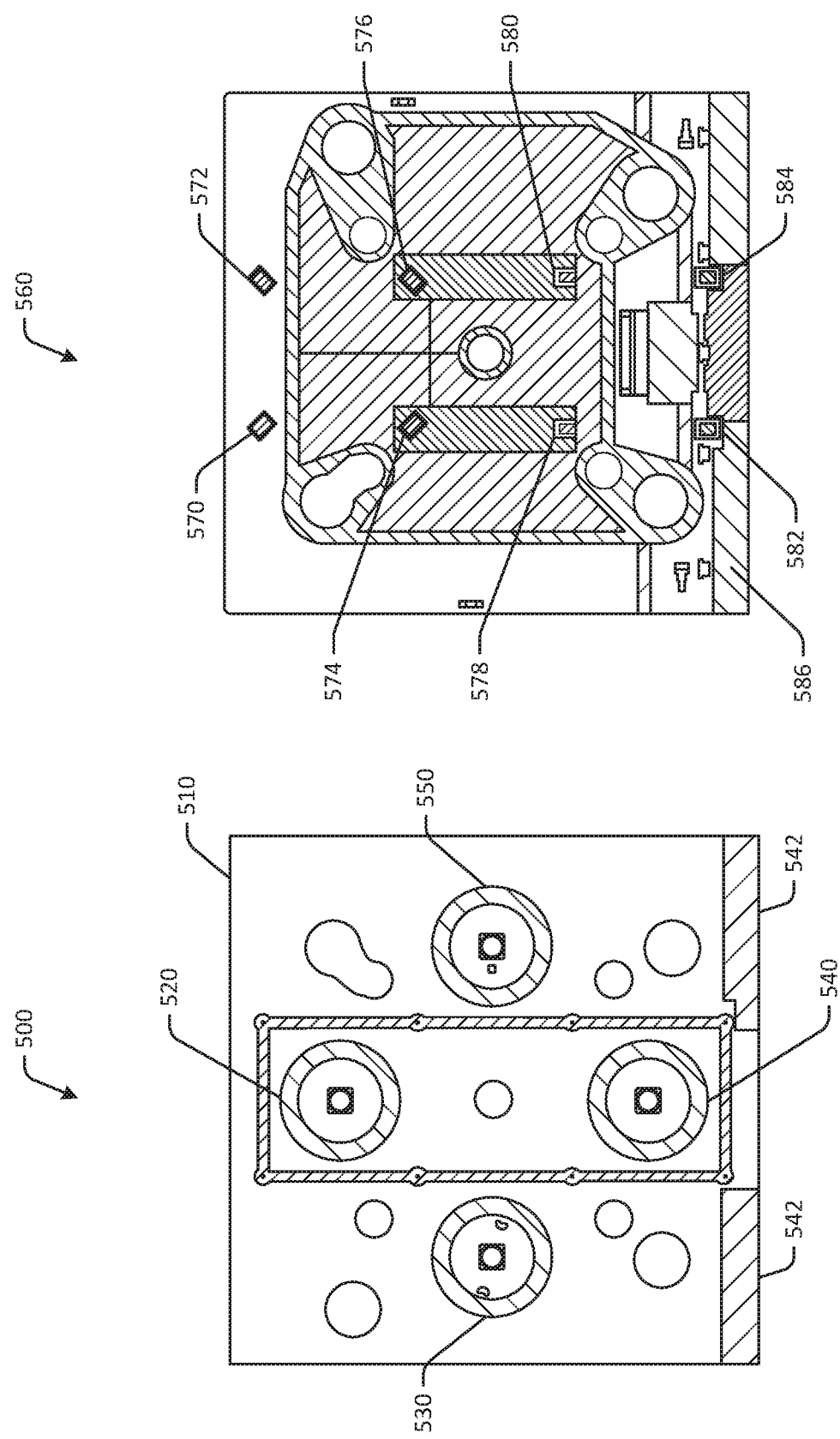
FIG. 5 is a schematic drawing of a microphone circuit board in accordance with one or more embodiments of the disclosure.

FIG. 5 schematically depicts a microphone circuit board 510 in accordance with one or more embodiments of the disclosure. A top view 500 of the microphone circuit board 510 is depicted, along with a bottom view 560.

One or more buttons or selectable physical controls, or components of buttons or controls, may be positioned on a first surface of the microphone circuit board 510. For example, a first button element 520 may correspond to a volume increase function, a second button element 530 may correspond to a device mute or cancel audio detection function, a third button element 540 may correspond to a volume decrease function, and a fourth button element 550 may correspond to an action function. The respective button elements may align with a rubber button component for users to select or interact with the button elements. Other embodiments may include a different number of button elements or a different arrangement. One or more of the buttons may be in contact with or may include electrostatic discharge rings to avoid electrical shocks to users. One or more WiFi antenna(e) 542 may be disposed along the first surface of the microphone circuit board 510.

The microphone circuit board 510 may include one or more microphones. For example, eight microphones may be positioned on a second surface of the microphone circuit board 510. A first microphone 570 may be angled in a first direction. A second microphone 572 may be angled in a second direction. A third microphone 574 may be angled in the first direction, and a fourth microphone 576 may be angled in the second direction. A fifth microphone 578, a sixth microphone 580, a seventh microphone 582, and an eighth microphone 584 may be angled in a third direction. The set of microphones may be arranged in an array or in a different arrangement. The set of microphones may be used to detect sound and generate an audio signal, and also to detect a location of sound that is captured by any of the microphones.

A white silk screen or white solder mask layer 586, or a layer of another reflective material, may be disposed adjacent an edge surface of the microphone circuit board. The white silk screen or white solder mask layer 586 may be positioned at least partially between one or more LEDs positioned on the microphone circuit board 510, and may reflect light emitted from the one or more LEDs to increase brightness and/or visibility. In some embodiments, a set of LEDs, such as about five LEDs, may be disposed on a surface of the microphone circuit board 510.

One or more antennae, such as WiFi antennae may be disposed on a surface of the microphone circuit board 510. For example, two WiFi antennae may be disposed on the second surface of the microphone circuit board 510, and may be electrically coupled to a controller positioned on the main circuit board via one or more RF cables. By separating the WiFi antennae from the HDMI port on the main circuit board, radio interference may be reduced.

Figure 6:
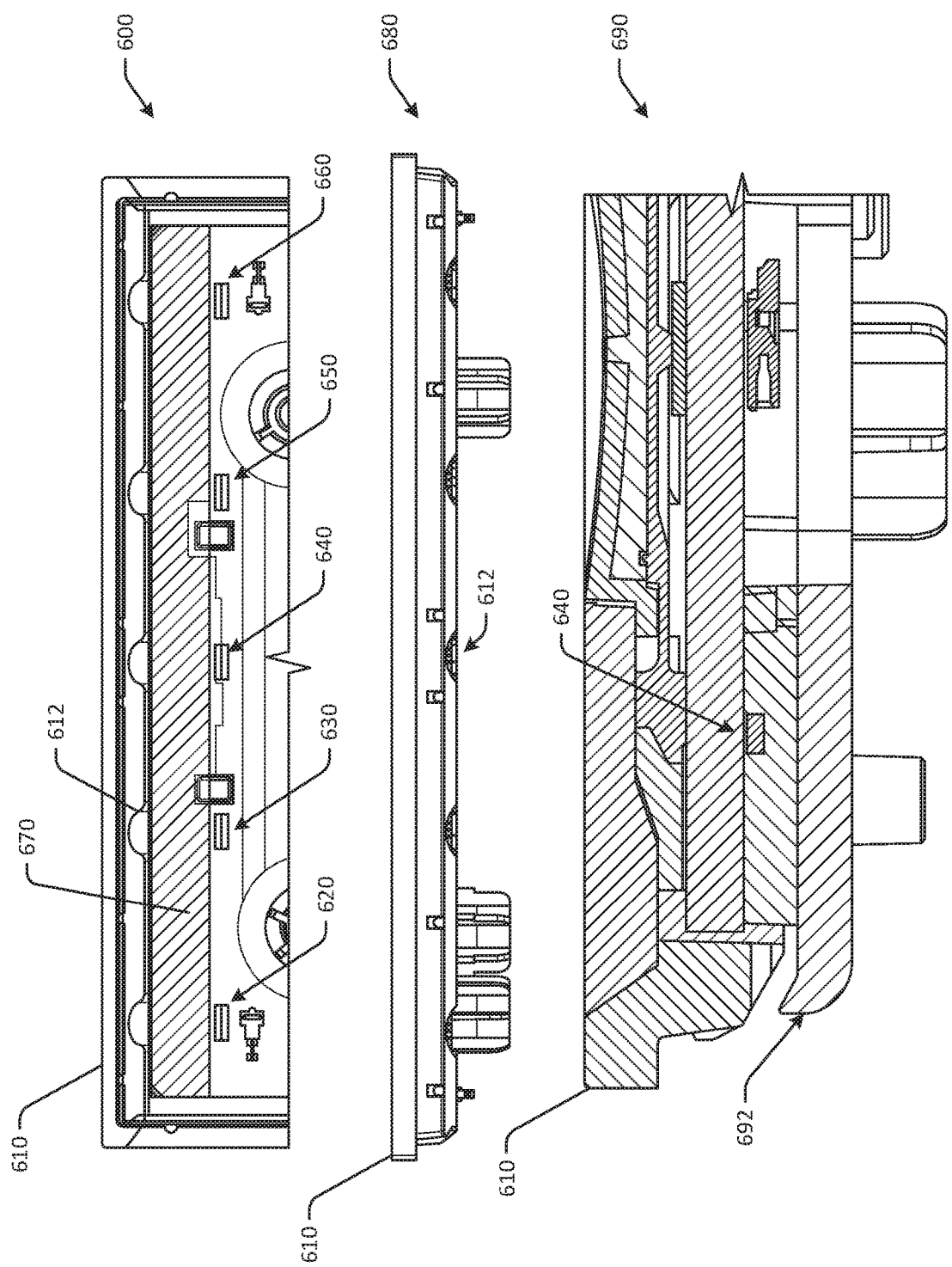
FIG. 6 is a schematic drawing of a light bar component in various views in accordance with one or more embodiments of the disclosure.
Figure 7:
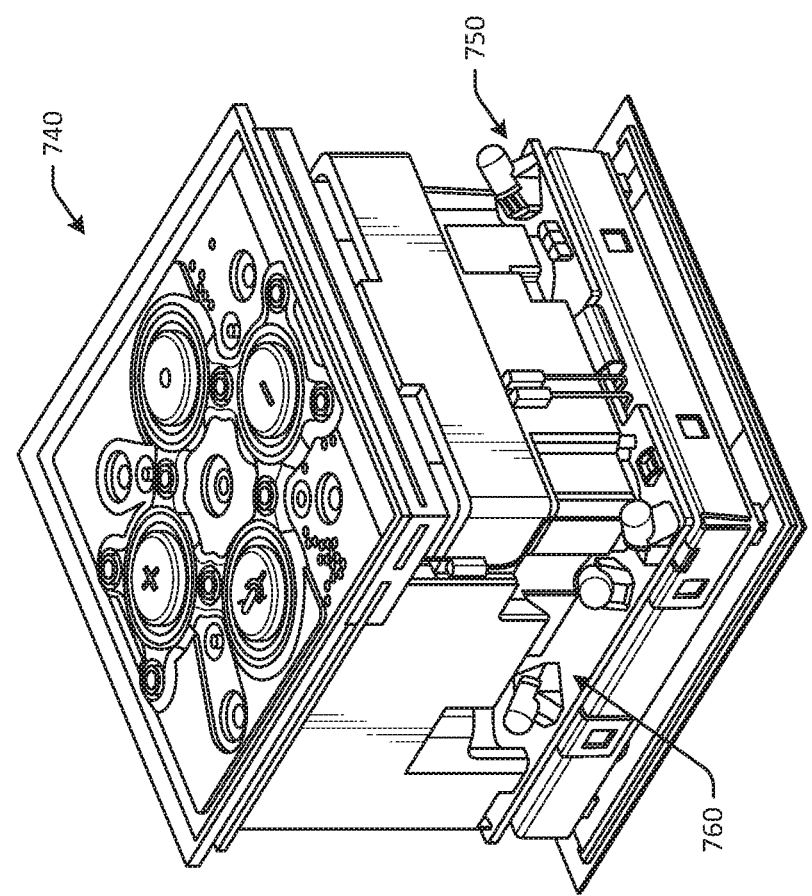
FIG. 7 is a schematic drawing of an interior portion of a device housing and a perspective view of internal components of the device in accordance with one or more embodiments of the disclosure.
Figure 7:
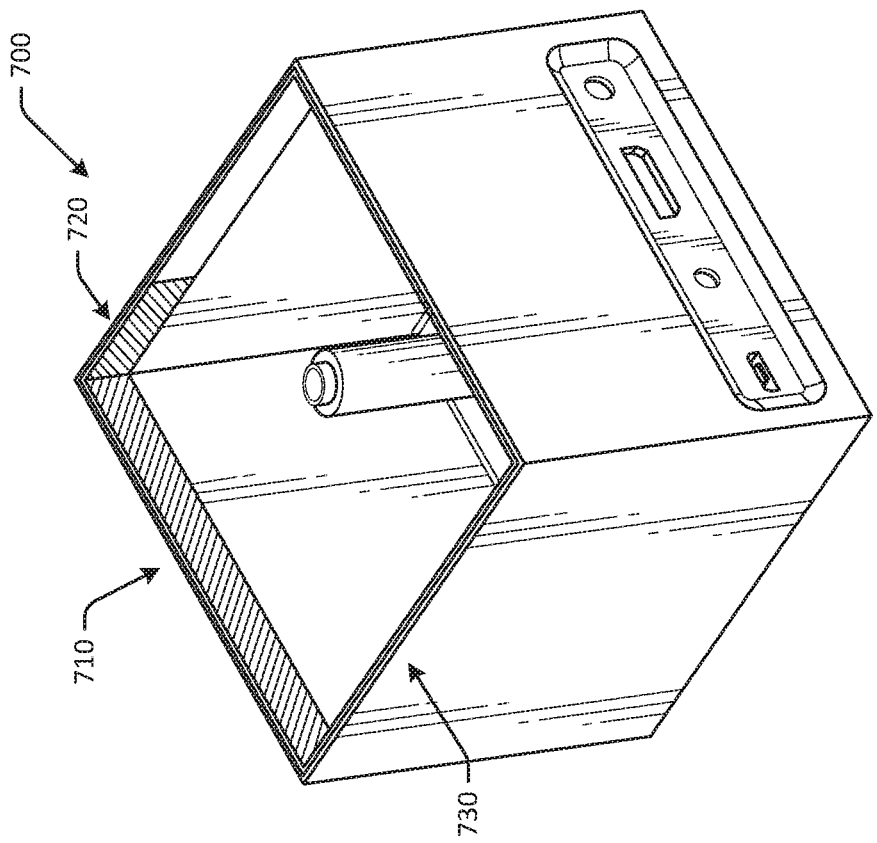

FIG. 6 schematically depicts a light bar component in various views in accordance with one or more embodiments of the disclosure. FIG. 7 is a schematic drawing of an interior portion of a device housing 700 and a perspective view of internal components of the device in accordance with one or more embodiments of the disclosure. The light bar component of FIG. 6 may be positioned in a housing, such as the housing 700 of FIG. 7. FIG. 7 will therefore be discussed in conjunction with FIG. 6.

In a top cross-sectional view 600 in FIG. 6, a light bar component may include a clear elongated member 610 with a number of cutouts 612. The clear elongated member 610 may be formed of a light diffusive material. The light bar component may be a linear light bar component configured to indicate a location of sound detected by a microphone of the device. The clear elongated member 610 may be positioned along an edge of a housing of a device. The cutouts 612 may be semicircular and may reduce hotspots and/or increase color uniformity across the clear elongated member 610. In some embodiments the elongated member may be colored or occluded rather than clear.

A set of LEDs may be positioned on a microphone circuit board adjacent to the clear elongated member 610. For example, a first LED 620, a second LED 630, a third LED 640, a fourth LED 650, and a fifth LED 660 may be positioned in a linear arrangement and may be adjacent to the clear elongated member 610. The LEDs may be colored LEDs or white LEDs, and may be side-firing LEDs, in that light is emitted from side portions of the LEDs, rather than directly towards the clear elongated member 610. A reflective material layer 670, such as a white silk screen or solder mask layer, may be positioned adjacent to the LEDs and may at least partially be positioned between the LEDs and the microphone circuit board, in some embodiments. Light emitted from the set of side-firing LEDs may be visible through the clear elongated component 610.

In a standalone view 680, the clear elongated member 610 is illustrated with the cutouts 612, which may be uniformly spaced along a surface of the clear elongated member 610 that aligns with the positioning of the LEDs. Accordingly, there may be five cutouts 612 to align with the five LEDs in the example of FIG. 5.

In a side cross-sectional view 690, the third LED 640 can be seen in cross-section, with clear elongated component 610 forming an edge of a housing of the device. A spacer 692 may be included and positioned adjacent to the microphone circuit board. The spacer 692 may increase a reflection of light emitted from the LEDs, so as to improve visibility of the light from outside the device.

The light bar component of FIG. 6 may be positioned in the housing 700 of FIG. 7. The housing 700 may include one or more portions of light blocking tape positioned adjacent to the light bar component, so as to prevent or reduce visibility of light emitted by the side-firing LEDs from portions of the housing other than the clear elongated component 610. For example, a first portion of light blocking tape 710 may be positioned along a front side edge of the housing 700, and a second portion of light blocking tape 720 may be positioned along a first side edge of the housing 700. A third portion of light blocking tape 730 may be positioned along a third side edge of the housing 700. The portions of light blocking tape may have different dimensions. The light blocking tape may be adhered to one or more interior or exterior surfaces of the housing 700. In some embodiments, light blocking tape may be adhered to internal components instead of, or in addition to, the device housing 700.

An internal component assembly 740, including the light bar component, may be positioned inside the housing 700. As illustrated in FIG. 7, a first infrared LED 750 and a second infrared LED 760 may be configured to emit infrared light through the walls of the housing 700. Accordingly, light emitted by the side-firing LEDs may be visible through the clear elongated component 610.

One or more operations of the methods, process flows, or use cases of FIGS. 1-7 may have been described above as being performed by a user device, or more specifically, by one or more program module(s), applications, or the like executing on a device. It should be appreciated, however, that any of the operations of the methods, process flows, or use cases of FIGS. 1-7 may be performed, at least in part, in a distributed manner by one or more other devices, or more specifically, by one or more program module(s), applications, or the like executing on such devices. In addition, it should be appreciated that processing performed in response to the execution of computer-executable instructions provided as part of an application, program module, or the like may be interchangeably described herein as being performed by the application or the program module itself or by a device on which the application, program module, or the like is executing. While the operations of the methods, process flows, or use cases of FIGS. 1-7 may be described in the context of the illustrative devices, it should be appreciated that such operations may be implemented in connection with numerous other device configurations.

The operations described and depicted in the illustrative methods, process flows, and use cases of FIGS. 1-7 may be carried out or performed in any suitable order, such as the depicted orders, as desired in various example embodiments of the disclosure. Additionally, in certain example embodiments, at least a portion of the operations may be carried out in parallel. Furthermore, in certain example embodiments, less, more, or different operations than those depicted in FIGS. 1-7 may be performed.

Although specific embodiments of the disclosure have been described, one of ordinary skill in the art will recognize that numerous other modifications and alternative embodiments are within the scope of the disclosure. For example, any of the functionality and/or processing capabilities described with respect to a particular device or component may be performed by any other device or component. Further, while various illustrative implementations and architectures have been described in accordance with embodiments of the disclosure, one of ordinary skill in the art will appreciate that numerous other modifications to the illustrative implementations and architectures described herein are also within the scope of this disclosure.

Certain aspects of the disclosure are described above with reference to block and flow diagrams of systems, methods, apparatuses, and/or computer program products according to example embodiments. It will be understood that one or more blocks of the block diagrams and flow diagrams, and combinations of blocks in the block diagrams and the flow diagrams, respectively, may be implemented by the execution of computer-executable program instructions. Likewise, some blocks of the block diagrams and flow diagrams may not necessarily need to be performed in the order presented, or may not necessarily need to be performed at all, according to some embodiments. Further, additional components and/or operations beyond those depicted in blocks of the block and/or flow diagrams may be present in certain embodiments.

Accordingly, blocks of the block diagrams and flow diagrams support combinations of means for performing the specified functions, combinations of elements or steps for performing the specified functions, and program instruction means for performing the specified functions. It will also be understood that each block of the block diagrams and flow diagrams, and combinations of blocks in the block diagrams and flow diagrams, may be implemented by special-purpose, hardware-based computer systems that perform the specified functions, elements or steps, or combinations of special-purpose hardware and computer instructions.

Illustrative Computer Architecture

Figure 8:
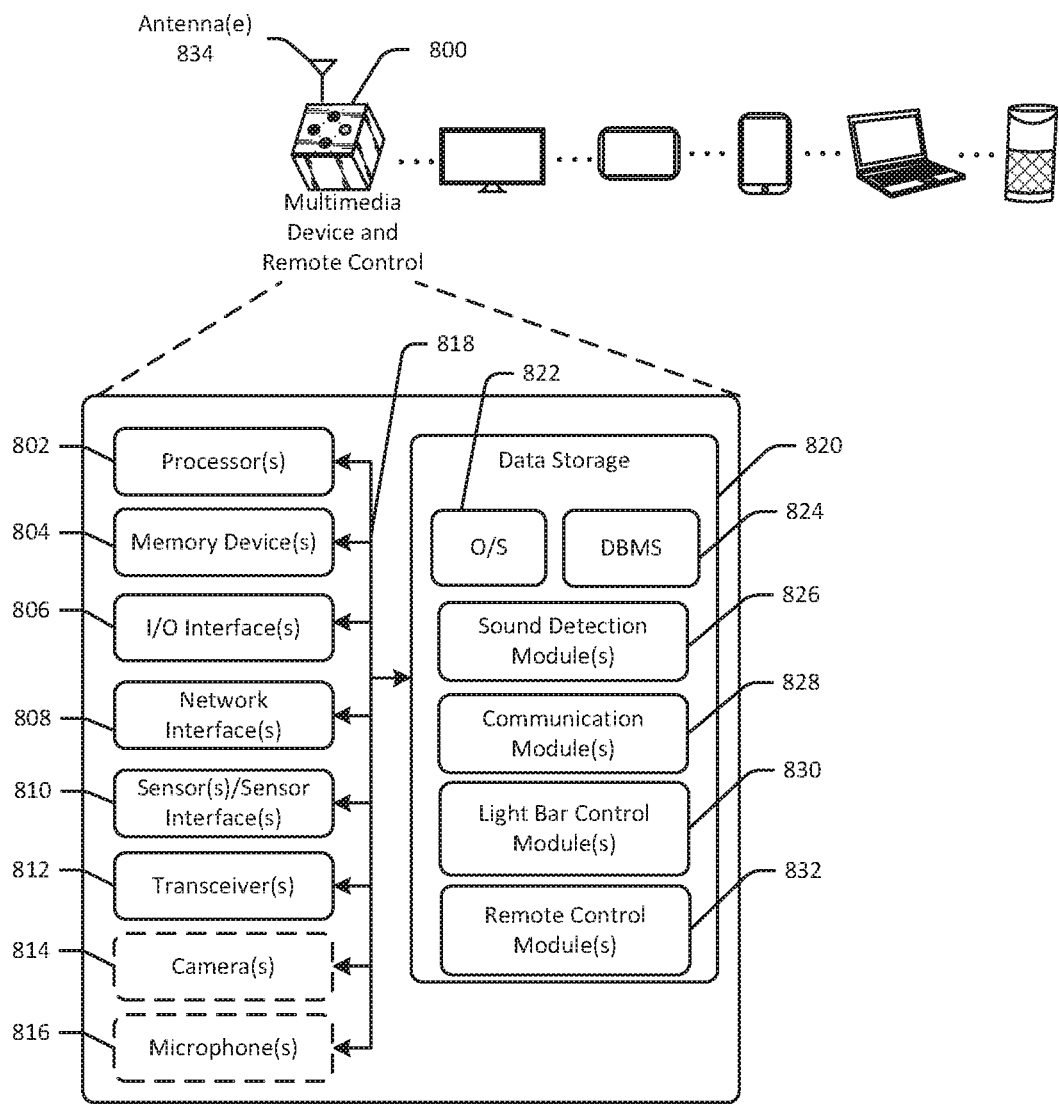
FIG. 8 schematically illustrates an example architecture of an electronic device in accordance with one or more embodiments of the disclosure.

FIG. 8 is a schematic block diagram of one or more illustrative multimedia device and remote control(s) 800 in accordance with one or more example embodiments of the disclosure. The multimedia device and remote control(s) 800 may include any suitable computing device including, but not limited to, a server system, a mobile device such as a smartphone, a tablet, an e-reader, a wearable device, or the like; a desktop computer; a laptop computer; a content streaming device; a set-top box; a scanning device; a barcode scanning wand; or the like. The multimedia device and remote control(s) 800 may correspond to an illustrative device configuration for the scanning device of FIGS. 1-7.

The multimedia device and remote control(s) 800 may be configured to communicate with one or more servers, user devices, or the like. The multimedia device and remote control(s) 800 may be configured to determine voice commands, determine wakeword utterances, determine and/or control other devices, and other operations. The multimedia device and remote control(s) 800 may be configured to emit light, detect sound, output digital content, and other functionality. In some embodiments, a single remote server or a single group of remote servers may be configured to perform more than one type of functionality in conjunction with a barcode scanning device.

The multimedia device and remote control(s) 800 may be configured to communicate via one or more networks. Such network(s) may include, but are not limited to, any one or more different types of communications networks such as, for example, cable networks, public networks (e.g., the Internet), private networks (e.g., frame-relay networks), wireless networks, cellular networks, telephone networks (e.g., a public switched telephone network), or any other suitable private or public packet-switched or circuit-switched networks. Further, such network(s) may have any suitable communication range associated therewith and may include, for example, global networks (e.g., the Internet), metropolitan area networks (MANs), wide area networks (WANs), local area networks (LANs), or personal area networks (PANs). In addition, such network(s) may include communication links and associated networking devices (e.g., link-layer switches, routers, etc.) for transmitting network traffic over any suitable type of medium including, but not limited to, coaxial cable, twisted-pair wire (e.g., twisted-pair copper wire), optical fiber, a hybrid fiber-coaxial (HFC) medium, a microwave medium, a radio frequency communication medium, a satellite communication medium, or any combination thereof.

In an illustrative configuration, the multimedia device and remote control(s) 800 may include one or more processors (processor(s)) 802, one or more memory devices 804 (also referred to herein as memory 804), one or more input/output (I/O) interface(s) 806, one or more network interface(s) 808, one or more sensor(s) or sensor interface(s) 810, one or more transceiver(s) 812, one or more optional camera(s) 814, one or more optional microphone(s) 816, and data storage 820. The multimedia device and remote control(s) 800 may further include one or more bus(es) 818 that functionally couple various components of the multimedia device and remote control(s) 800. The multimedia device and remote control(s) 800 may further include one or more antenna(e) 834 that may include, without limitation, a cellular antenna for transmitting or receiving signals to/from a cellular network infrastructure, an antenna for transmitting or receiving Wi-Fi signals to/from an access point (AP), a Global Navigation Satellite System (GNSS) antenna for receiving GNSS signals from a GNSS satellite, a Bluetooth antenna for transmitting or receiving Bluetooth signals, a Near Field Communication (NFC) antenna for transmitting or receiving NFC signals, and so forth. These various components will be described in more detail hereinafter.

The bus(es) 818 may include at least one of a system bus, a memory bus, an address bus, or a message bus, and may permit the exchange of information (e.g., data (including computer-executable code), signaling, etc.) between various components of the multimedia device and remote control(s) 800. The bus(es) 818 may include, without limitation, a memory bus or a memory controller, a peripheral bus, an accelerated graphics port, and so forth. The bus(es) 818 may be associated with any suitable bus architecture including, without limitation, an Industry Standard Architecture (ISA), a Micro Channel Architecture (MCA), an Enhanced ISA (EISA), a Video Electronics Standards Association (VESA) architecture, an Accelerated Graphics Port (AGP) architecture, a Peripheral Component Interconnect (PCI) architecture, a PCI-Express architecture, a Personal Computer Memory Card International Association (PCMCIA) architecture, a Universal Serial Bus (USB) architecture, and so forth.

The memory 804 of the multimedia device and remote control(s) 800 may include volatile memory (memory that maintains its state when supplied with power) such as random access memory (RAM) and/or non-volatile memory (memory that maintains its state even when not supplied with power) such as read-only memory (ROM), flash memory, ferroelectric RAM (FRAM), and so forth. Persistent data storage, as that term is used herein, may include non-volatile memory. In certain example embodiments, volatile memory may enable faster read/write access than non-volatile memory. However, in certain other example embodiments, certain types of non-volatile memory (e.g., FRAM) may enable faster read/write access than certain types of volatile memory.

In various implementations, the memory 804 may include multiple different types of memory such as various types of static random access memory (SRAM), various types of dynamic random access memory (DRAM), various types of unalterable ROM, and/or writeable variants of ROM such as electrically erasable programmable read-only memory (EEPROM), flash memory, and so forth. The memory 804 may include main memory as well as various forms of cache memory such as instruction cache(s), data cache(s), translation lookaside buffer(s) (TLBs), and so forth. Further, cache memory such as a data cache may be a multi-level cache organized as a hierarchy of one or more cache levels (L1, L2, etc.).

The data storage 820 may include removable storage and/or non-removable storage including, but not limited to, magnetic storage, optical disk storage, and/or tape storage. The data storage 820 may provide non-volatile storage of computer-executable instructions and other data. The memory 804 and the data storage 820, removable and/or non-removable, are examples of computer-readable storage media (CRSM) as that term is used herein.

The data storage 820 may store computer-executable code, instructions, or the like that may be loadable into the memory 804 and executable by the processor(s) 802 to cause the processor(s) 802 to perform or initiate various operations. The data storage 820 may additionally store data that may be copied to the memory 804 for use by the processor(s) 802 during the execution of the computer-executable instructions. Moreover, output data generated as a result of execution of the computer-executable instructions by the processor(s) 802 may be stored initially in the memory 804, and may ultimately be copied to the data storage 820 for non-volatile storage.

More specifically, the data storage 820 may store one or more operating systems (O/S) 822; one or more database management systems (DBMS) 824; and one or more program module(s), applications, engines, computer-executable code, scripts, or the like such as, for example, one or more sound detection module(s) 826, one or more communication module(s) 828, one or more light bar control module(s) 830, and/or one or more remote control module(s) 832. Some or all of these module(s) may be sub-module(s). Any of the components depicted as being stored in the data storage 820 may include any combination of software, firmware, and/or hardware. The software and/or firmware may include computer-executable code, instructions, or the like that may be loaded into the memory 804 for execution by one or more of the processor(s) 802. Any of the components depicted as being stored in the data storage 820 may support functionality described in reference to corresponding components named earlier in this disclosure.

The data storage 820 may further store various types of data utilized by the components of the multimedia device and remote control(s) 800. Any data stored in the data storage 820 may be loaded into the memory 804 for use by the processor(s) 802 in executing computer-executable code. In addition, any data depicted as being stored in the data storage 820 may potentially be stored in one or more datastore(s) and may be accessed via the DBMS 824 and loaded in the memory 804 for use by the processor(s) 802 in executing computer-executable code. The datastore(s) may include, but are not limited to, databases (e.g., relational, object-oriented, etc.), file systems, flat files, distributed datastores in which data is stored on more than one node of a computer network, peer-to-peer network datastores, or the like. In FIG. 8, an example datastore(s) may include, for example, historical data for previously identified products, purchase or order history, user profile information, and/or other information.

The processor(s) 802 may be configured to access the memory 804 and execute the computer-executable instructions loaded therein. For example, the processor(s) 802 may be configured to execute the computer-executable instructions of the various program module(s), applications, engines, or the like of the multimedia device and remote control(s) 800 to cause or facilitate various operations to be performed in accordance with one or more embodiments of the disclosure. The processor(s) 802 may include any suitable processing unit capable of accepting data as input, processing the input data in accordance with stored computer-executable instructions, and generating output data. The processor(s) 802 may include any type of suitable processing unit including, but not limited to, a central processing unit, a microprocessor, a Reduced Instruction Set Computer (RISC) microprocessor, a Complex Instruction Set Computer (CISC) microprocessor, a microcontroller, an Application Specific Integrated Circuit (ASIC), a Field-Programmable Gate Array (FPGA), a System-on-a-Chip (SoC), a digital signal processor (DSP), and so forth. Further, the processor(s) 802 may have any suitable microarchitecture design that includes any number of constituent components such as, for example, registers, multiplexers, arithmetic logic units, cache controllers for controlling read/write operations to cache memory, branch predictors, or the like. The microarchitecture design of the processor(s) 802 may be capable of supporting any of a variety of instruction sets.

Referring now to functionality supported by the various program module(s) depicted in FIG. 8, the sound detection module(s) 826 may include computer-executable instructions, code, or the like that responsive to execution by one or more of the processor(s) 802 may perform functions including, but not limited to, detect sound, determine sound meanings, generate audio signals and audio data, determine a location of sound, and the like.

The communication module(s) 828 may include computer-executable instructions, code, or the like that responsive to execution by one or more of the processor(s) 802 may perform functions including, but not limited to, sending and/or receiving data, including content, sending and/or receiving instructions and commands, and the like.

The light bar control module(s) 830 may include computer-executable instructions, code, or the like that responsive to execution by one or more of the processor(s) 802 may perform functions including, but not limited to, determining a light bar illumination status, determining which LEDs to illuminate, causing a change in illumination status, and the like.

The remote control module(s) 832 may include computer-executable instructions, code, or the like that responsive to execution by one or more of the processor(s) 802 may perform functions including, but not limited to, controlling other electronic devices, sending infrared signals, sending or outputting digital audio or video signals, and the like.

Referring now to other illustrative components depicted as being stored in the data storage 820, the 0/S 822 may be loaded from the data storage 820 into the memory 804 and may provide an interface between other application software executing on the multimedia device and remote control(s) 800 and the hardware resources of the multimedia device and remote control(s) 800. More specifically, the 0/S 822 may include a set of computer-executable instructions for managing the hardware resources of the multimedia device and remote control(s) 800 and for providing common services to other application programs (e.g., managing memory allocation among various application programs). In certain example embodiments, the 0/S 822 may control execution of the other program module(s). The O/S 822 may include any operating system now known or which may be developed in the future including, but not limited to, any server operating system, any mainframe operating system, or any other proprietary or non-proprietary operating system.

The DBMS 824 may be loaded into the memory 804 and may support functionality for accessing, retrieving, storing, and/or manipulating data stored in the memory 804 and/or data stored in the data storage 820. The DBMS 824 may use any of a variety of database models (e.g., relational model, object model, etc.) and may support any of a variety of query languages. The DBMS 824 may access data represented in one or more data schemas and stored in any suitable data repository including, but not limited to, databases (e.g., relational, object-oriented, etc.), file systems, flat files, distributed datastores in which data is stored on more than one node of a computer network, peer-to-peer network datastores, or the like. In those example embodiments in which the multimedia device and remote control(s) 800 is a mobile device, the DBMS 824 may be any suitable lightweight DBMS optimized for performance on a mobile device.

Referring now to other illustrative components of the multimedia device and remote control(s) 800, the input/output (I/O) interface(s) 806 may facilitate the receipt of input information by the multimedia device and remote control(s) 800 from one or more I/O devices as well as the output of information from the multimedia device and remote control(s) 800 to the one or more I/O devices. The I/O devices may include any of a variety of components such as a display or display screen having a touch surface or touchscreen; an audio output device for producing sound, such as a speaker; an audio capture device, such as a microphone; an image and/or video capture device, such as a camera; a haptic unit; and so forth. Any of these components may be integrated into the multimedia device and remote control(s) 800 or may be separate. The I/O devices may further include, for example, any number of peripheral devices such as data storage devices, printing devices, and so forth.

The I/O interface(s) 806 may also include an interface for an external peripheral device connection such as universal serial bus (USB), FireWire, Thunderbolt, Ethernet port or other connection protocol that may connect to one or more networks. The I/O interface(s) 806 may also include a connection to one or more of the antenna(e) 834 to connect to one or more networks via a wireless local area network (WLAN) (such as Wi-Fi) radio, Bluetooth, ZigBee, and/or a wireless network radio, such as a radio capable of communication with a wireless communication network such as a Long Term Evolution (LTE) network, WiMAX network, 3G network, a ZigBee network, etc.

The multimedia device and remote control(s) 800 may further include one or more network interface(s) 808 via which the multimedia device and remote control(s) 800 may communicate with any of a variety of other systems, platforms, networks, devices, and so forth. The network interface(s) 808 may enable communication, for example, with one or more wireless routers, one or more host servers, one or more web servers, and the like via one or more networks.

The antenna(e) 834 may include any suitable type of antenna depending, for example, on the communications protocols used to transmit or receive signals via the antenna(e) 834. Non-limiting examples of suitable antennae may include directional antennae, non-directional antennae, dipole antennae, folded dipole antennae, patch antennae, multiple-input multiple-output (MIMO) antennae, or the like. The antenna(e) 834 may be communicatively coupled to one or more transceivers 812 or radio components to which or from which signals may be transmitted or received.

As previously described, the antenna(e) 834 may include a cellular antenna configured to transmit or receive signals in accordance with established standards and protocols, such as Global System for Mobile Communications (GSM), 3G standards (e.g., Universal Mobile Telecommunications System (UMTS), Wideband Code Division Multiple Access (W-CDMA), CDMA2000, etc.), 4G standards (e.g., Long-Term Evolution (LTE), WiMax, etc.), direct satellite communications, or the like.

The antenna(e) 834 may additionally, or alternatively, include a Wi-Fi antenna configured to transmit or receive signals in accordance with established standards and protocols, such as the IEEE 802.11 family of standards, including via 2.4 GHz channels (e.g., 802.11b, 802.11g, 802.11n), 5 GHz channels (e.g., 802.11n, 802.11ac), or 60 GHz channels (e.g., 802.11ad). In alternative example embodiments, the antenna(e) 834 may be configured to transmit or receive radio frequency signals within any suitable frequency range forming part of the unlicensed portion of the radio spectrum.

The antenna(e) 834 may additionally, or alternatively, include a GNSS antenna configured to receive GNSS signals from three or more GNSS satellites carrying time-position information to triangulate a position therefrom. Such a GNSS antenna may be configured to receive GNSS signals from any current or planned GNSS such as, for example, the Global Positioning System (GPS), the GLONASS System, the Compass Navigation System, the Galileo System, or the Indian Regional Navigational System.

The transceiver(s) 812 may include any suitable radio component(s) for—in cooperation with the antenna(e) 834—transmitting or receiving radio frequency (RF) signals in the bandwidth and/or channels corresponding to the communications protocols utilized by the multimedia device and remote control(s) 800 to communicate with other devices. The transceiver(s) 812 may include hardware, software, and/or firmware for modulating, transmitting, or receiving—potentially in cooperation with any of antenna(e) 834—communications signals according to any of the communications protocols discussed above including, but not limited to, one or more Wi-Fi and/or Wi-Fi direct protocols, as standardized by the IEEE 802.11 standards, one or more non-Wi-Fi protocols, or one or more cellular communications protocols or standards. The transceiver(s) 812 may further include hardware, firmware, or software for receiving GNSS signals. The transceiver(s) 812 may include any known receiver and baseband suitable for communicating via the communications protocols utilized by the multimedia device and remote control(s) 800. The transceiver(s) 812 may further include a low noise amplifier (LNA), additional signal amplifiers, an analog-to-digital (A/D) converter, one or more buffers, a digital baseband, or the like.

The sensor(s)/sensor interface(s) 810 may include or may be capable of interfacing with any suitable type of sensing device such as, for example, inertial sensors, force sensors, thermal sensors, photocells, and so forth. Example types of inertial sensors may include accelerometers (e.g., MEMS-based accelerometers), gyroscopes, and so forth.

The camera(s) 814 may be any device configured to capture ambient light or images. The microphone(s) 816 may be any device configured to receive analog sound input or voice data.

It should be appreciated that the program module(s), applications, computer-executable instructions, code, or the like depicted in FIG. 8 as being stored in the data storage 820 are merely illustrative and not exhaustive and that processing described as being supported by any particular module may alternatively be distributed across multiple module(s) or performed by a different module. In addition, various program module(s), script(s), plug-in(s), Application Programming Interface(s) (API(s)), or any other suitable computer-executable code hosted locally on the multimedia device and remote control(s) 800, and/or hosted on other computing device(s) accessible via one or more networks, may be provided to support functionality provided by the program module(s), applications, or computer-executable code depicted in FIG. 8 and/or additional or alternate functionality. Further, functionality may be modularized differently such that processing described as being supported collectively by the collection of program module(s) depicted in FIG. 8 may be performed by a fewer or greater number of module(s), or functionality described as being supported by any particular module may be supported, at least in part, by another module. In addition, program module(s) that support the functionality described herein may form part of one or more applications executable across any number of systems or devices in accordance with any suitable computing model such as, for example, a client-server model, a peer-to-peer model, and so forth. In addition, any of the functionality described as being supported by any of the program module(s) depicted in FIG. 8 may be implemented, at least partially, in hardware and/or firmware across any number of devices.

It should further be appreciated that the multimedia device and remote control(s) 800 may include alternate and/or additional hardware, software, or firmware components beyond those described or depicted without departing from the scope of the disclosure. More particularly, it should be appreciated that software, firmware, or hardware components depicted as forming part of the multimedia device and remote control(s) 800 are merely illustrative and that some components may not be present or additional components may be provided in various embodiments. While various illustrative program module(s) have been depicted and described as software module(s) stored in the data storage 820, it should be appreciated that functionality described as being supported by the program module(s) may be enabled by any combination of hardware, software, and/or firmware. It should further be appreciated that each of the above-mentioned module(s) may, in various embodiments, represent a logical partitioning of supported functionality. This logical partitioning is depicted for ease of explanation of the functionality and may not be representative of the structure of software, hardware, and/or firmware for implementing the functionality. Accordingly, it should be appreciated that functionality described as being provided by a particular module may, in various embodiments, be provided at least in part by one or more other module(s). Further, one or more depicted module(s) may not be present in certain embodiments, while in other embodiments, additional module(s) not depicted may be present and may support at least a portion of the described functionality and/or additional functionality. Moreover, while certain module(s) may be depicted and described as sub-module(s) of another module, in certain embodiments, such module(s) may be provided as independent module(s) or as sub-module(s) of other module(s).

One or more operations of the methods, process flows, and use cases of FIGS. 1-7 may be performed by a device having the illustrative configuration depicted in FIG. 8, or more specifically, by one or more engines, program module(s), applications, or the like executable on such a device. It should be appreciated, however, that such operations may be implemented in connection with numerous other device configurations.

The operations described and depicted in the illustrative methods and process flows of FIGS. 1-7 may be carried out or performed in any suitable order as desired in various example embodiments of the disclosure. Additionally, in certain example embodiments, at least a portion of the operations may be carried out in parallel. Furthermore, in certain example embodiments, less, more, or different operations than those depicted in FIGS. 1-7 may be performed.

Although specific embodiments of the disclosure have been described, one of ordinary skill in the art will recognize that numerous other modifications and alternative embodiments are within the scope of the disclosure. For example, any of the functionality and/or processing capabilities described with respect to a particular device or component may be performed by any other device or component. Further, while various illustrative implementations and architectures have been described in accordance with embodiments of the disclosure, one of ordinary skill in the art will appreciate that numerous other modifications to the illustrative implementations and architectures described herein are also within the scope of this disclosure.

Certain aspects of the disclosure are described above with reference to block and flow diagrams of systems, methods, apparatuses, and/or computer program products according to example embodiments. It will be understood that one or more blocks of the block diagrams and flow diagrams, and combinations of blocks in the block diagrams and the flow diagrams, respectively, may be implemented by execution of computer-executable program instructions. Likewise, some blocks of the block diagrams and flow diagrams may not necessarily need to be performed in the order presented, or may not necessarily need to be performed at all, according to some embodiments. Further, additional components and/or operations beyond those depicted in blocks of the block and/or flow diagrams may be present in certain embodiments.

Accordingly, blocks of the block diagrams and flow diagrams support combinations of means for performing the specified functions, combinations of elements or steps for performing the specified functions, and program instruction means for performing the specified functions. It will also be understood that each block of the block diagrams and flow diagrams, and combinations of blocks in the block diagrams and flow diagrams, may be implemented by special-purpose, hardware-based computer systems that perform the specified functions, elements or steps, or combinations of special-purpose hardware and computer instructions.

Program module(s), applications, or the like disclosed herein may include one or more software components including, for example, software objects, methods, data structures, or the like. Each such software component may include computer-executable instructions that, responsive to execution, cause at least a portion of the functionality described herein (e.g., one or more operations of the illustrative methods described herein) to be performed.

A software component may be coded in any of a variety of programming languages. An illustrative programming language may be a lower-level programming language such as an assembly language associated with a particular hardware architecture and/or operating system platform. A software component comprising assembly language instructions may require conversion into executable machine code by an assembler prior to execution by the hardware architecture and/or platform.

Another example programming language may be a higher-level programming language that may be portable across multiple architectures. A software component comprising higher-level programming language instructions may require conversion to an intermediate representation by an interpreter or a compiler prior to execution.

Other examples of programming languages include, but are not limited to, a macro language, a shell or command language, a job control language, a script language, a database query or search language, or a report writing language. In one or more example embodiments, a software component comprising instructions in one of the foregoing examples of programming languages may be executed directly by an operating system or other software component without having to be first transformed into another form.

A software component may be stored as a file or other data storage construct. Software components of a similar type or functionally related may be stored together such as, for example, in a particular directory, folder, or library. Software components may be static (e.g., pre-established or fixed) or dynamic (e.g., created or modified at the time of execution).

Software components may invoke or be invoked by other software components through any of a wide variety of mechanisms. Invoked or invoking software components may comprise other custom-developed application software, operating system functionality (e.g., device drivers, data storage (e.g., file management) routines, other common routines and services, etc.), or third-party software components (e.g., middleware, encryption, or other security software, database management software, file transfer or other network communication software, mathematical or statistical software, image processing software, and format translation software).

Software components associated with a particular solution or system may reside and be executed on a single platform or may be distributed across multiple platforms. The multiple platforms may be associated with more than one hardware vendor, underlying chip technology, or operating system. Furthermore, software components associated with a particular solution or system may be initially written in one or more programming languages, but may invoke software components written in another programming language.

Computer-executable program instructions may be loaded onto a special-purpose computer or other particular machine, a processor, or other programmable data processing apparatus to produce a particular machine, such that execution of the instructions on the computer, processor, or other programmable data processing apparatus causes one or more functions or operations specified in the flow diagrams to be performed. These computer program instructions may also be stored in a computer-readable storage medium (CRSM) that upon execution may direct a computer or other programmable data processing apparatus to function in a particular manner, such that the instructions stored in the computer-readable storage medium produce an article of manufacture including instruction means that implement one or more functions or operations specified in the flow diagrams. The computer program instructions may also be loaded onto a computer or other programmable data processing apparatus to cause a series of operational elements or steps to be performed on the computer or other programmable apparatus to produce a computer-implemented process.

Additional types of CRSM that may be present in any of the devices described herein may include, but are not limited to, programmable random access memory (PRAM), SRAM, DRAM, RAM, ROM, electrically erasable programmable read-only memory (EEPROM), flash memory or other memory technology, compact disc read-only memory (CD-ROM), digital versatile disc (DVD) or other optical storage, magnetic cassettes, magnetic tape, magnetic disk storage or other magnetic storage devices, or any other medium which can be used to store the information and which can be accessed. Combinations of any of the above are also included within the scope of CRSM. Alternatively, computer-readable communication media (CRCM) may include computer-readable instructions, program module(s), or other data transmitted within a data signal, such as a carrier wave, or other transmission. However, as used herein, CRSM does not include CRCM.

Although embodiments have been described in language specific to structural features and/or methodological acts, it is to be understood that the disclosure is not necessarily limited to the specific features or acts described. Rather, the specific features and acts are disclosed as illustrative forms of implementing the embodiments. Conditional language, such as, among others, "can," "could," "might," or "may," unless specifically stated otherwise, or otherwise understood within the context as used, is generally intended to convey that certain embodiments could include, while other embodiments do not include, certain features, elements, and/or steps. Thus, such conditional language is not generally intended to imply that features, elements, and/or steps are in any way required for one or more embodiments or that one or more embodiments necessarily include logic for deciding, with or without user input or prompting, whether these features, elements, and/or steps are included or are to be performed in any particular embodiment.

That which is claimed is:
1. A voice-activated remote control device comprising:
a housing;
a loudspeaker;
a microphone configured to generate an audio signal representing speech input;
a high definition multimedia interface (HDMI) port positioned on a first side of a main printed circuit board;
a set of infrared light emitting diodes (infrared LEDs) positioned on a second side of the main printed circuit board, the set of infrared LEDs comprising:

a first infrared LED oriented in a first direction, wherein a central axis of the first infrared LED forms a first angle with respect to a first edge of the main printed circuit board;
a second infrared LED oriented in a second direction, wherein a central axis of the second infrared LED forms the first angle with respect to the first edge;
a third infrared LED oriented in a third direction that is opposite the second direction, wherein a central axis of the third infrared LED forms the first angle with respect to a second edge of the main printed circuit board;
a fourth infrared LED oriented in a fourth direction that is opposite the first direction, wherein a central axis of the fourth infrared LED forms the first angle with respect to the second edge;
a fifth infrared LED oriented in a fifth direction with a central axis of the fifth infrared LED substantially aligned with the second edge; and
a sixth infrared LED oriented in a sixth direction that is opposite the fifth direction with a central axis of the sixth infrared LED substantially aligned with the first edge.

2. The voice-activated remote control device of claim 1, wherein the housing comprises a front side and a back side, the remote control further comprising:
a clear elongated component coupled to an edge of the housing at the front side;
a set of side-firing LEDs disposed in a linear arrangement on the microphone printed circuit board, wherein light emitted from the set of side-firing LEDs is visible through the clear elongated component;
a white silk screen layer disposed on the microphone printed circuit board adjacent to the set of side-firing LEDs, the white silk screen layer configured to at least partially reflect the light emitted from the set of side-firing LEDs; and
a light blocking tape coupled to an interior surface of the front side of the housing, the light blocking tape configured to at least partially block the light emitted from the set of side-firing LEDs.

3. The voice-activated remote control device of claim 1, further comprising:
a WiFi antenna disposed on the microphone printed circuit board; and
a WiFi shield component disposed on the second side of the main printed circuit board;
wherein the WiFi shield component is disposed between the WiFi antenna and the HDMI port.

4. The voice-activated remote control device of claim 1, wherein the main printed circuit board comprises a first quadrant, a second quadrant, a third quadrant, and a fourth quadrant; and
wherein the first infrared LED is positioned in the first quadrant, the second infrared LED and the sixth infrared LED are positioned in the second quadrant, the third infrared LED is positioned in the third quadrant, and the fourth infrared LED and the fifth infrared LED are positioned in the fourth quadrant.

5. A device comprising:
a housing;
a first circuit board;
a second circuit board;
a light bar component;
a light blocking material adhered to an interior surface of the housing;
a first infrared light emitting diode (LED) positioned on the first circuit board and configured to emit infrared light in a first direction;
a second infrared LED positioned on the first circuit board and configured to emit infrared light in a second direction opposite the first direction;
a microphone disposed on the second circuit board; and
a high definition multimedia interface (HDMI) port.

6. The device of claim 5, wherein the light bar component is a linear light bar component that is configured to indicate a direction of a sound source based on sound input detected by the microphone.

7. The device of claim 6, further comprising:
a set of LEDs disposed in a linear arrangement on the second circuit board; and
a reflective material layer disposed on the second circuit board.

8. The device of claim 5, further comprising:
a third infrared LED positioned on the first circuit board and configured to emit infrared light in a third direction that is transverse to the first direction; and
a fourth infrared LED positioned on the first circuit board and configured to emit infrared light in a fourth direction opposite the third direction.

9. The device of claim 8, wherein the first circuit board comprises a first quadrant, a second quadrant, a third quadrant, and a fourth quadrant; and
wherein the first infrared LED is positioned in the first quadrant, the second infrared LED is positioned in the second quadrant, the third infrared LED is positioned in the third quadrant, and the fourth infrared LED is positioned in the fourth quadrant.

10. The device of claim 5, wherein the first infrared LED is positioned near a first corner of the first circuit board, and the second infrared LED is positioned near a second corner of the first circuit board, wherein the first corner is diagonally opposite the second corner.

11. The device of claim 5, wherein the HDMI port is disposed on a first side of the first circuit board, and wherein the first infrared LED and the second infrared LED are disposed on a second side of the first circuit board.

12. The device of claim 5, wherein a central axis of the first infrared LED is angled toward a corner of the first circuit board formed by a first edge and a second edge, such that the central axis traverses the first edge and the second edge.

13. The device of claim 5, further comprising:
a third infrared LED positioned on the first circuit board and configured to emit infrared light in a third direction that is transverse to the first direction;
a fourth infrared LED positioned on the first circuit board and configured to emit infrared light in a fourth direction opposite the third direction;
a fifth infrared LED positioned on the first circuit board and configured to emit infrared light in a fifth direction parallel to a first edge of the first circuit board; and
a sixth infrared LED positioned on the first circuit board and configured to emit infrared light in a sixth direction parallel to a second edge of the first circuit board.

14. The device of claim 13, wherein the fifth direction is opposite the sixth direction and the first edge is parallel to the second edge.

15. The device of claim 13, wherein a first distance between the first infrared LED and the second infrared LED is different than a second distance between the third infrared LED and the fourth infrared LED.

16. The device of claim 5, wherein the first infrared LED is offset a first distance from a first edge of the first circuit board, and the second infrared LED is offset a second distance from a second edge of the first circuit board, wherein the first edge is parallel to the second edge and the first edge and second edge form perimeter edges of the first circuit board.

17. A speaker device comprising:
- a speaker;
- a microphone;
- a housing comprising a plurality of sidewalls;
- a set of infrared light emitting diodes (LEDs) configured to emit infrared light through the plurality of sidewalls;
- a set of LEDs disposed in a linear arrangement on a circuit board;
- a light blocking material adhered to an interior surface of the housing adjacent to the set of LEDs;
- a high definition multimedia interface (HDMI) port; and
- a linear light bar component positioned along an edge of the housing.

18. The speaker device of claim 17, wherein the linear light bar component is configured to indicate a direction of a sound source based on sound input detected by the microphone.

19. The speaker device of claim 17, wherein the set of infrared LEDs comprises:
- a first infrared light emitting diode (LED) configured to emit infrared light in a first direction;
- a second infrared LED configured to emit infrared light in a second direction opposite the first direction;
- a third infrared LED configured to emit infrared light in a third direction that is transverse to the first direction;
- a fourth infrared LED configured to emit infrared light in a fourth direction opposite the third direction;
- a fifth infrared LED configured to emit infrared light in a fifth direction parallel to a first edge of the circuit board; and
- a sixth infrared LED configured to emit infrared light in a sixth direction parallel to a second edge of the circuit board.

20. The speaker device of claim 17, wherein the speaker is disposed on a lower surface of the speaker device.

* * * * *